US011795391B2

(12) United States Patent
Takeda et al.

(10) Patent No.: US 11,795,391 B2
(45) Date of Patent: Oct. 24, 2023

(54) RED PHOSPHOR AND LIGHT EMITTING DEVICE

(71) Applicant: DENKA COMPANY LIMITED, Tokyo (JP)

(72) Inventors: Yusuke Takeda, Omuta (JP); Tomohiro Nomiyama, Omuta (JP); Marina Takamura, Omuta (JP); Shintaro Watanabe, Omuta (JP)

(73) Assignee: DENKA COMPANY LIMITED, Tokyo (JP)

( * ) Notice: Subject to any disclaimer, the term of this patent is extended or adjusted under 35 U.S.C. 154(b) by 566 days.

(21) Appl. No.: 17/056,631

(22) PCT Filed: Apr. 8, 2019

(86) PCT No.: PCT/JP2019/015362
§ 371 (c)(1),
(2) Date: Nov. 18, 2020

(87) PCT Pub. No.: WO2019/220816
PCT Pub. Date: Nov. 21, 2019

(65) Prior Publication Data
US 2021/0207026 A1  Jul. 8, 2021

(30) Foreign Application Priority Data

May 18, 2018 (JP) ................................ 2018-096315

(51) Int. Cl.
*C09K 11/77* (2006.01)
*H01L 33/50* (2010.01)
(Continued)

(52) U.S. Cl.
CPC .... *C09K 11/77348* (2021.01); *C01B 21/0602* (2013.01); *C09K 11/0883* (2013.01);
(Continued)

(58) Field of Classification Search
CPC .......... C09K 11/77348; C09K 11/0883; C01B 21/0602; H01L 33/502; C01P 2002/54;
(Continued)

(56) References Cited

U.S. PATENT DOCUMENTS 8,946,981 B2 *  2/2015  Hirosaki ............ C09K 11/7787
                                                        252/301.4 F
2007/0007494 A1  1/2007  Hirosaki et al.
2017/0058197 A1  3/2017  Nishimata et al.

FOREIGN PATENT DOCUMENTS

JP  2004-071726 A   3/2004
JP  2015-203096 A  11/2015
(Continued)

OTHER PUBLICATIONS

May 14, 2019 Search Report issued in International Patent Application No. PCT/JP2019/015362.
(Continued)

*Primary Examiner* — Tu-Tu V Ho
(74) *Attorney, Agent, or Firm* — Oliff PLC

(57) ABSTRACT

A phosphor having a main crystal phase having a crystal structure identical to that of CaAlSiN$_3$, and including a Ca element partially replaced with an Eu element, wherein the phosphor has a median size d50 of 12.0 μm or more and 22.0 μm or less, as measured according to a laser diffraction scattering method, and has a specific surface area of 1.50 m$^2$/g or more and 10.00 m$^2$/g or less, as measured according to a BET method.

4 Claims, 1 Drawing Sheet

(51) Int. Cl.
    *C01B 21/06*     (2006.01)
    *C09K 11/08*     (2006.01)
(52) U.S. Cl.
    CPC ........ H01L 33/502 (2013.01); *C01P 2002/54* (2013.01); *C01P 2004/02* (2013.01); *C01P 2004/61* (2013.01); *C01P 2006/12* (2013.01); *C01P 2006/60* (2013.01)
(58) Field of Classification Search
    CPC ............. C01P 2004/02; C01P 2004/61; C01P 2006/12; C01P 2006/60
    USPC .......................................................... 257/98
    See application file for complete search history.

(56)              References Cited

FOREIGN PATENT DOCUMENTS

| | | |
|---|---|---|
| JP | 2017-043761 A | 3/2017 |
| JP | 2017-179187 A | 10/2017 |
| JP | 2017-210626 A | 11/2017 |
| WO | 2005/052087 A1 | 6/2005 |
| WO | 2015/001860 A1 | 1/2015 |

OTHER PUBLICATIONS

Nov. 24, 2020 International Preliminary Report on Patentability issued in International Patent Application No. PCT/JP2019/015362.

* cited by examiner

RED PHOSPHOR AND LIGHT EMITTING DEVICE

TECHNICAL FIELD

The invention relates to a red phosphor for a LED (Light Emitting Diode) or a LD (Laser Diode), and a light-emitting apparatus using the red phosphor. More specifically, the invention relates to a red phosphor high in brightness, and a light-emitting apparatus excellent in brightness by use of the red phosphor.

BACKGROUND ART

White LEDs are devices that emit pseudo-white light by combinations of semiconductor light-emitting elements and phosphors, and combinations of blue LEDs and YAG yellow phosphors are known as typical examples. However, the white LEDs of such systems, while are categorized to those in white regions in terms of the chromaticity coordinate values, are insufficient in red light-emitting components and thus low in color rendition ability in an application of illumination, and image display apparatuses such as liquid crystal backlights have the problem of inferior color reproducibility. There is then proposed a combination use of a YAG phosphor with a nitride or oxynitride phosphor that emits red light, in order to supplement such an insufficient red light-emitting component (Patent Literature 1).

As a nitride phosphor that emits red light, there is known a phosphor including an inorganic compound having a crystal structure identical to that of $CaAlSiN_3$ (also commonly described as "CASN"), as a host crystal, which is activated with an optically active element such as $Eu^{2+}$. Patent Literature 2 describes the following: a phosphor (namely, a CASN phosphor activated with Eu) obtained by activating a host crystal of CASN with $Eu^{2+}$ emits light at a high brightness. Such a CASN phosphor is demanded to be much more enhanced in brightness when used for a white LED, because the emission color thereof includes many spectral components at longer wavelengths in the red region to thereby enable the high and depth color rendition ability to be realized, but includes also many spectral components low in luminosity factor.

Furthermore, Patent Literature 2 describes the following: there is obtained a phosphor (namely, a SCASN phosphor activated with Eu) in which a host crystal (also commonly described as "SCASN") also designated as $(Sr,Ca)AlSiN_3$, where Ca of the $CaAlSiN_3$ is partially replaced additionally with Sr, is activated with $Eu^{2+}$.

Patent Literature 3 describes the following: a SCASN phosphor and a CASN phosphor are each determined in terms of a specific surface area and enhanced in moisture resistance, and thus suppressed in light-emitting failures in a high-temperature/high-humidity state. However, such suppression is insufficient for obtaining a red phosphor high in brightness.

Patent Literature 4 describes the following: a CASN phosphor which is controlled in a specified grain size range and which is high in brightness is obtained by a specified raw material constitution.

CITATION LIST

Patent Literature

Patent Literature 1: Japanese Patent Laid-Open No. 2004-071726
Patent Literature 2: International Publication No. WO2005/052087
Patent Literature 3: Japanese Patent Laid-Open No. 2015-203096
Patent Literature 4: Japanese Patent Laid-Open No. 2017-043761

SUMMARY OF INVENTION

Technical Problem

White LEDs that emit white light by combining semiconductor light-emitting elements and phosphors are demanded to be increased in color rendition ability and increased in brightness. Thus, CASN phosphors as red phosphors are also demanded to be phosphors higher in brightness than conventional phosphors, but the phosphors described in Patent Literature 1 to 4 above are actually insufficient.

Solution to Problem

The inventors have made intensive studies for solving the above problems, and as a result, have found that a CASN phosphor, which is controlled in the median size d50 thereof, as measured according to a laser diffraction scattering method, and in the specific surface area thereof, as measured according to a BET method, in respective specified ranges, thus achieves a higher brightness than a phosphor according to the prior art, thereby leading to the invention.

That is, the invention can provide the following.

(1) A phosphor having a main crystal phase having a crystal structure identical to that of $CaAlSiN_3$, and including a Ca element partially replaced with an Eu element, wherein the phosphor has a median size d50 of 12.0 μm or more and 22.0 μm or less, as measured according to a laser diffraction scattering method, and has a specific surface area of 1.50 $m^2/g$ or more and 10.00 $m^2/g$ or less, as measured according to a BET method.

(2) The phosphor according to (1), having a content of oxygen of 1.00% by mass or more and 3.50% by mass or less.

(3) The phosphor according to (1) or (2), wherein an emission peak wavelength in excitation by light at a wavelength of 455 nm is 645 nm or more and 680 nm or less, and an x value and a y value of CIE chromaticity coordinates of an emission color are 0.662 or more and 0.710 or less and 0.290 or more and 0.328 or less, respectively.

(4) A light-emitting apparatus including the phosphor according to any one of (1) to (3), and a light-emitting element.

Advantageous Effects of Invention

According to the invention, a red phosphor excellent in brightness can be provided, and furthermore a light-emitting apparatus high in brightness, and light-emitting equipment including an instrument receiving the light-emitting apparatus can be provided. Examples of such light-emitting equipment to which the invention can be applied include an illumination apparatus, a backlight apparatus, an image display apparatus, and a signal apparatus.

DESCRIPTION OF EMBODIMENT

Figure 1:
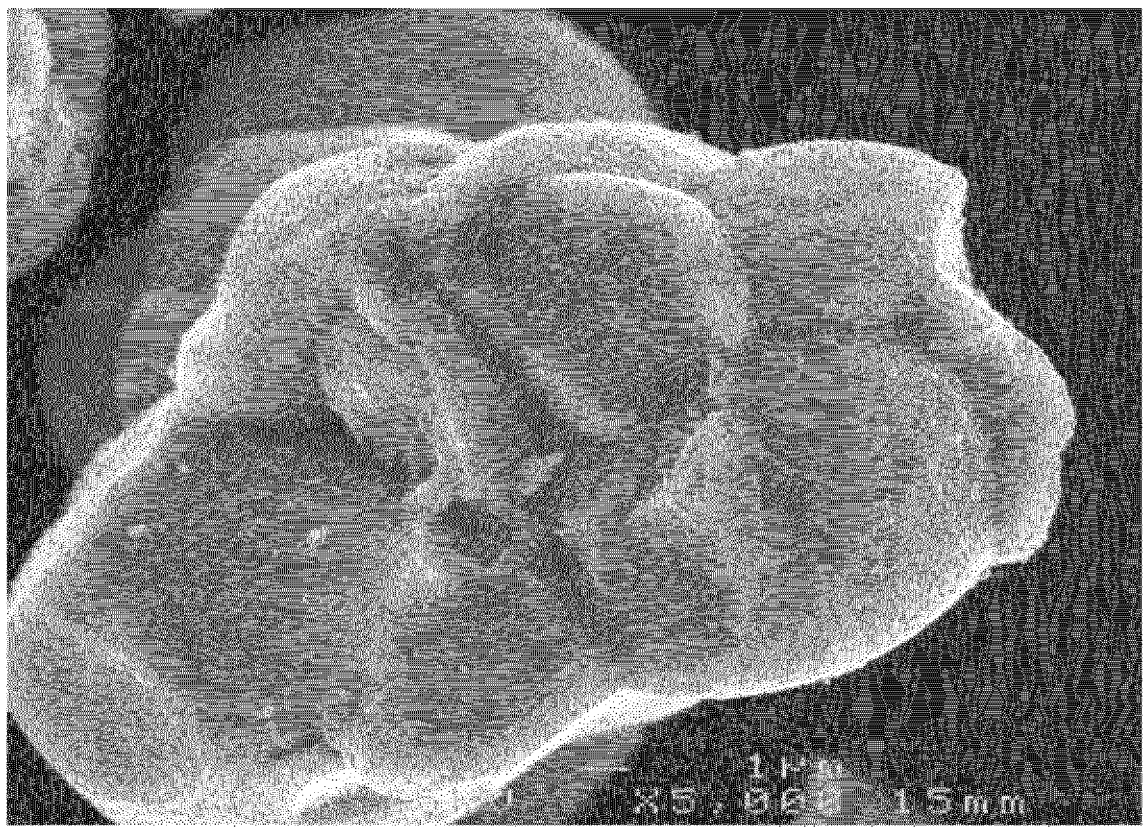
FIG. 1 A microphotograph of a phosphor obtained in Example 1 according to an embodiment of the invention.

Hereinafter, modes for carrying out the invention will be described in detail.

The main crystal phase of the phosphor of the invention has a structure identical to that of a $CaAlSiN_3$ crystal phase. Whether or not the main crystal phase of the phosphor has a structure identical to that of a $CaAlSiN_3$ crystal phase can be confirmed by powder X-ray diffraction. A case where the crystal structure is different from that of $CaAlSiN_3$ is not preferable because the color of light emission is not a red color or the intensity of fluorescence is significantly reduced. The crystal phase is preferably such a single crystal phase, and may include a different phase as long as characteristics of the phosphor are not largely affected.

The backbone structure of a $CaAlSiN_3$ crystal is any structure which is formed by binding of $(Si,Al)$—$N_4$ regular tetrahedron and in which a Ca atom is positioned in the gap. $Ca^{2+}$ is partially replaced with $Eu^{2+}$ serving as a light emission center, thereby providing a red phosphor.

The content rate of Eu as an activation element of the phosphor of the invention is preferably 0.01% by atom or more and 1.0% by atom or less, particularly preferably 0.03% by atom or more and 0.5% by atom or less because a too low content rate tends to cause such an element to less contribute to light emission and a too high content rate tends to cause concentration quenching of the phosphor due to energy transfer of $Eu^{2+}$ to occur.

The phosphor of the invention includes a trace amount of oxygen (O) as an inevitable component. The share of an M element, the Si/Al ratio, the N/O ratio, and the like are adjusted such that not only the crystal structure is maintained, but also electroneutrality as a whole is kept.

The average grain size in the phosphor of the invention, if so small, tends to result in a reduction in intensity of fluorescence, and, if so large, tends to result in the variation in chromaticity of an emission color and/or the variation in emission color in mounting of the phosphor on a light-emission surface of a LED, and thus is required to be 12.0 μm or more and 22.0 μm or less and is preferably 13.0 μm or more and/or 21.0 μm or less. The average grain size herein refers to the median size d50 as measured by a laser diffraction scattering method according to JIS R1622:1995 and R1629:1997.

The phosphor of the invention preferably has a $CaAlSiN_3$ crystal phase as a main crystal phase, and preferably has a layer (hereinafter, surface layer) having chemical composition different from that of a host crystal thereof, on a surface of the phosphor. It is generally known that, when nitride is exposed in the air, an oxide film (i.e., native oxide film) is produced on a surface.

The phosphor of the invention can be reduced in surface defects due to formation of a layer different in properties from a native oxide film, a surface layer, or can be increased in light extraction efficiency due to the difference in refractive index between the $CaAlSiN_3$ crystal phase and the surface layer, and a phosphor high in light-emitting efficiency can be obtained. While formation of the surface layer increases the specific surface area relative to the average grain size, the specific surface area is required to be 1.50 $m^2/g$ or more and 10.00 $m^2/g$ or less, and is preferably 2.00 $m^2/g$ or more or 7.50 $m^2/g$ or more. The specific surface area is herein measured according to a BET method. Specifically, the specific surface area of the phosphor is measured with a specific surface area measuring apparatus (Macsorb HM-1201 model manufactured by Mountech Co., Ltd.) according to specific surface area measurement of a powder (solid) with gas adsorption in JIS Z8830:2013.

The surface layer is preferably an oxide film or a hydroxide film whose composition includes oxygen, and the content of oxygen in a phosphor including the surface layer is preferably 1.00% by mass or more and 3.50% by mass or less, particularly preferably 1.30% by mass or more and 3.00% or less. A too low content of oxygen in the phosphor cannot allow for formation of a surface layer having a sufficient thickness, and a too high content thereof increases the thickness of the surface layer to cause a reduction in light-emitting efficiency.

The phosphor of the invention is a red phosphor high in color rendition ability and high in brightness. The emission peak wavelength ($\lambda p$) in excitation by light having a peak in the wavelength range of 250 nm or more and 550 nm or less (in particular, in excitation by light at a wavelength of 455 nm) is preferably 645 nm or more and 680 nm or less because a too short wavelength causes color rendition ability to be low and a too long wavelength causes a dark red to be exhibited.

The emission color of the phosphor can be expressed by the x value and the y value of the XYZ color system as one of the CIE chromaticity coordinates. The x value and the y value of the CIE chromaticity coordinates of the phosphor of the invention are preferably 0.662 or more and 0.710 or less and 0.290 or more and 0.328 or less, respectively. The x value and the y value of the CIE chromaticity coordinates of the phosphor can be calculated from an emission spectrum in the range from 465 nm to 780 nm, according to JIS Z8724:1997.

The method for producing the phosphor of the invention, here used, can be the same production method as in that of a conventional $CaAlSiN_3$ phosphor. A method is here exemplified which involves firing a raw material-mixed powder capable of forming a composition represented by the general formula, in a determined temperature range in a nitrogen atmosphere.

In the production method, any nitride of each constituent element, namely, calcium nitride, silicon nitride, aluminum nitride or europium nitride is suitably used as a raw material, and any oxide thereof can also be used. For example, an easily available europium oxide may be used as a europium source which serves as a light emission center and thus is added in a very small amount.

The method for mixing the above-mentioned raw materials is not particularly limited, and calcium nitride and europium nitride which react violently with moisture and oxygen in the air are suitably handled in a glove box in which the atmosphere is replaced with an inert atmosphere.

The firing container is preferably formed from any material which is stable in a nitrogen atmosphere at a high temperature and which hardly reacts with the raw material-mixed powder and a reaction product thereof, and examples thereof include a container made of boron nitride, a container made of a high melting point metal, and a container made of carbon.

The firing container filled with the raw material-mixed powder is taken out from the glove box and rapidly installed in a firing furnace, and the powder is fired at 1600° C. or more and 2000° C. or less in a nitrogen atmosphere. A too low firing temperature causes an increase in amount of remaining of an unreacted substance, and a too high firing temperature is not preferable because the main phase of a crystal structure identical to that of $CaAlSiN_3$ is degraded.

The firing time is selected in such a way as to fall within a time range which does not cause any failure, for example, the presence of a large amount of an unreacted substance, insufficient grain growth, or deterioration in productivity, and is preferably 2 hours or more and 24 hours or less.

The pressure of the firing atmosphere is selected depending on the firing temperature. While the phosphor of the invention can be stably present at the atmospheric pressure at a temperature of up to about 1800° C., a pressurized atmosphere is required at a temperature equal to or more than that temperature in order to suppress degradation of the phosphor. The higher the atmosphere pressure is, the higher the degradation temperature of the phosphor is, and the pressure is preferably less than 1 MPa in consideration of industrial productivity.

The state of a fired product is varied and is in the form of a powdery, clumped, or sintered body depending on compounding of the raw materials and the firing conditions. In the case of use as a phosphor, the fired product is formed into a powder having a determined size, by combining crushing, pulverizing and/or classification operation(s).

An acid treatment step is preferably provided after a pulverizing step in the method for producing the phosphor. The aqueous solution for use in the acid treatment step is preferably an aqueous solution of one or more acids of hydrochloric acid, formic acid, acetic acid, sulfuric acid, and nitric acid, further preferably is an aqueous solution of only hydrochloric acid. The acid treatment step is a step of dispersing the phosphor after the pulverizing step, in the above-mentioned aqueous solution of any acid(s), stirring the resultant for several minutes to several hours for a reaction, thereafter subjecting the resultant to warming as a boiling treatment until boiling is made, maintaining such a boiling state with stirring for several minutes to several hours, and then performing washing with water. Such an acid treatment can dissolve and remove any impurity element derived from the firing container, a different phase generated in the firing step, any impurity element included in the raw materials, and any impurity element incorporated in the pulverizing step, and further boiling can form the surface layer on the phosphor. The acid treatment step and the boiling treatment step can also be simultaneously performed in order to simplify such steps.

Formation of the surface layer can be controlled by varying the concentration and the temperature of an acid solution in an acid boiling treatment step in the method for producing the phosphor. A thicker surface layer can be formed by increasing the concentration of the acid solution or the temperature of the acid solution in the acid boiling treatment step.

The concentration of the acid solution in the acid boiling treatment step in the method for producing the phosphor of the invention is preferably 0.5 mol/l or more and 2.5 mol/l or less, and the temperature thereof is preferably 45° C. or more and 100° C. or less.

The phosphor of the invention can be used in a light-emitting apparatus configured from a light-emitting light source and the phosphor. The phosphor has light-emitting characteristics with a fluorescent peak near a wavelength of 650 nm in particular due to irradiation with ultraviolet light or visible light of a wavelength of 350 nm or more and 500 nm or less as an excitation source, and thus white light is easily obtained by a combination with a light-emitting light source such as an ultraviolet LED or a blue LED, or, if necessary, by a further combination with a green-to-yellow phosphor and/or a blue phosphor.

EXAMPLES

Examples of the invention will be described in detail with reference to Table 1. Table 1 shows the average grain size, specific surface area, content of oxygen, and light-emitting characteristics of each phosphor of Examples and Comparative Examples.

TABLE 1

| | Conditions of acid boiling treatment step | | Characteristics of phosphor | | | | | |
|---|---|---|---|---|---|---|---|---|
| | Acid concentration | Temperature | d50 (μm) | BET (m2/g) | Amount of oxygen (%) | Emission peak wavelength (nm) | Chromaticity coordinates | Emission peak intensity (%) |
| | | | | | | | x value / y value | |
| Example 1 | 1.0 mol/l | 80° C. | 13.9 | 4.11 | 1.82 | 653 | 0.671 / 0.326 | 100% |
| Comparative Example 1 | — | — | 13.8 | 0.30 | 0.76 | 653 | 0.671 / 0.326 | 96% |
| Example 2 | 1.0 mol/l | 80° C. | 15.8 | 3.15 | 1.65 | 653 | 0.672 / 0.325 | 102% |
| Example 3 | 1.0 mol/l | 80° C. | 20.3 | 2.01 | 1.41 | 654 | 0.675 / 0.324 | 103% |
| Example 4 | 2.1 mol/l | 80° C. | 15.8 | 7.22 | 2.68 | 651 | 0.670 / 0.327 | 101% |
| Example 5 | 1.0 mol/l | 50° C. | 16.5 | 2.81 | 1.21 | 653 | 0.672 / 0.326 | 99% |
| Comparative Example 2 | 1.0 mol/l | 30° C. | 16.6 | 0.65 | 0.84 | 653 | 0.671 / 0.326 | 94% |
| Comparative Example 3 | 3.2 mol/l | 80° C. | 16.8 | 12.92 | 3.92 | 651 | 0.668 / 0.329 | 97% |
| Comparative Example 4 | 1.0 mol/l | 80° C. | 9.0 | 5.51 | 2.76 | 650 | 0.665 / 0.331 | 91% |
| Comparative Example 5 | 1.0 mol/l | 80° C. | 3.3 | 8.34 | 4.91 | 648 | 0.648 / 0.344 | 57% |
| Example 6 | 1.0 mol/l | 80° C. | 15.5 | 3.04 | 1.61 | 661 | 0.689 / 0.310 | 104% |

Example 1

An α-silicon nitride powder ($Si_3H_4$, SN-E10 grade manufactured by Ube Industries, Ltd.), a calcium nitride powder ($Ca_3N_2$, manufactured by Materion Corporation), an aluminum nitride powder (AlN, E grade manufactured by Tokuyama Corporation) and europium oxide ($Eu_2O_3$, RU grade manufactured by Shin-Etsu Chemical Co., Ltd.), as raw materials of a phosphor of Example 1, were used at a ratio of Ca:Eu:Al:Si=0.994:0.006:1.00:1.00.

First, $Si_3H_4$, AlN and $Eu_2O_3$ among the raw materials were dry mixed by a V-type mixing machine for 10 minutes. The raw materials after mixing were classified by a nylon sieve having an aperture of 250 μm in order to uniform the sizes of the raw materials after mixing, thereby providing a raw material mixture.

The raw material mixture which passed through the sieve was transferred to a glove box capable of keeping a nitrogen atmosphere having a moisture content of 1 ppm by mass or less and an oxygen content of 1 ppm by mass or less, $Ca_3N_2$ was here compounded into the raw material mixture, and the resultant was dry mixed. The resultant was again classified by a nylon sieve having an aperture of 250 μm in order to uniform the sizes of the raw materials dry mixed. A cylindrical container equipped with a lid and made of boron nitride (N-1 grade manufactured by Denka Company Limited) was filled with 250 g of the raw materials after classification.

The container filled with the raw materials was taken out from the glove box and rapidly installed in an electric furnace of a carbon heater, and the inside of the furnace was sufficiently evacuated to a vacuum of 0.1 Pa or less. Heating was started under evacuation to vacuum, a nitrogen gas was introduced at 650° C., and the atmosphere pressure in the furnace was 0.1 MPa. The temperature was then raised to 1850° C. also after gas introduction, and firing at 1850° C. was performed for 8 hours.

After cooling, a sample recovered from the furnace was a red clumped product, and was crushed in a mortar and finally allowed to fully pass through a sieve having an aperture of 75 μm.

The resulting phosphor sample was subjected to powder X-ray diffraction using CuKα-ray by use of an X-ray diffraction apparatus ("UltimaIV" manufactured by Rigaku Corporation). The same diffraction pattern as that of a $CaAlSiN_3$ crystal was observed in the resulting X-ray diffraction pattern.

The sample which passed through the sieve was loaded to a hydrochloric acid solution at 80° C., having a concentration of 1.0 mol/l, and a boiling treatment was performed for 1 hour with a hydrochloric acid slurry being stirred. After the boiling treatment, cooling to room temperature was made and filtration was then performed to separate a phosphor and an acid treatment liquid. The phosphor was dried in a dryer at 100° C. to 120° C. for 12 hours, the phosphor after drying was classified by a sieve having an aperture of 75 μm, and only the phosphor which passed through the sieve was collected.

Method for Measuring Average Grain Size

The average grain size was measured by a laser diffraction scattering method with a grain size distribution measurement apparatus ("Microtrac MT3000II" manufactured by MicrotracBEL Corp.).

Method for Measuring Specific Surface Area

The specific surface area was measured with a specific surface area measuring apparatus ("Macsorb HM-1201" model manufactured by Mountech Co., Ltd.) according to specific surface area measurement of a powder (solid) with gas adsorption in JIS Z 8830:2013. A measurement sample was here obtained by a degassing treatment in a nitrogen gas flow at 0.30 mPa and 300° C. for 20 minutes in advance and sampling of 4.0 g of the resultant.

Method for Measuring Content of Oxygen

The content of oxygen was measured with an oxygen/nitrogen analyzer ("EMGA-920" manufactured by Horiba Ltd.). The measurement was made by placing a sample in a graphite crucible, removing a surface adsorbate at 280° C. (melting voltage: 0.5 KW), then raising the temperature to 2400° C. (melting voltage: 5.5 KW), and subtracting the background value measured with respect to an empty graphite crucible treated in advance in the same conditions, resulting in the amount of oxygen.

<Methods for Measuring Emission Peak Wavelength, Chromaticity Coordinates, and Emission Peak Intensity>

Fluorescence measurement was performed using Rhodamine B and a spectrofluorophotometer ("F-7000" manufactured by Hitachi High-Technologies Corporation) corrected by a sub-standard light source. A solid sample holder provided with a photometer was used in the measurement, and an emission spectrum at an excitation wavelength of 455 nm was determined. The emission peak wavelength determined from the resulting emission spectrum was 652 nm. Furthermore, in the emission spectrum the x value and the y value of the CIE chromaticity coordinates in the XYZ color system prescribed in JIS Z8701:1999 were calculated from an emission spectrum in the range from 465 nm to 780 nm according to JIS Z8724:1997. The x value and the y value were 0.671 and 0.326, respectively. The emission peak intensity was expressed by any unit because of being varied depending on the measurement apparatus and conditions, and was relatively determined by comparison between those in Examples and Comparative Examples measured under the same conditions. The emission peak intensity in Table 1 was represented as a relative value under the assumption that the emission peak intensity in Example 1 as a standard was 100%. Any intensity of 99% or more was determined as an excellent brightness.

The evaluation results of the phosphor obtained in Example 1 are shown in Table 1. A microphotograph of the phosphor obtained in Example 1 is illustrated in FIG. 1.

Comparative Example 1

Figure 2:
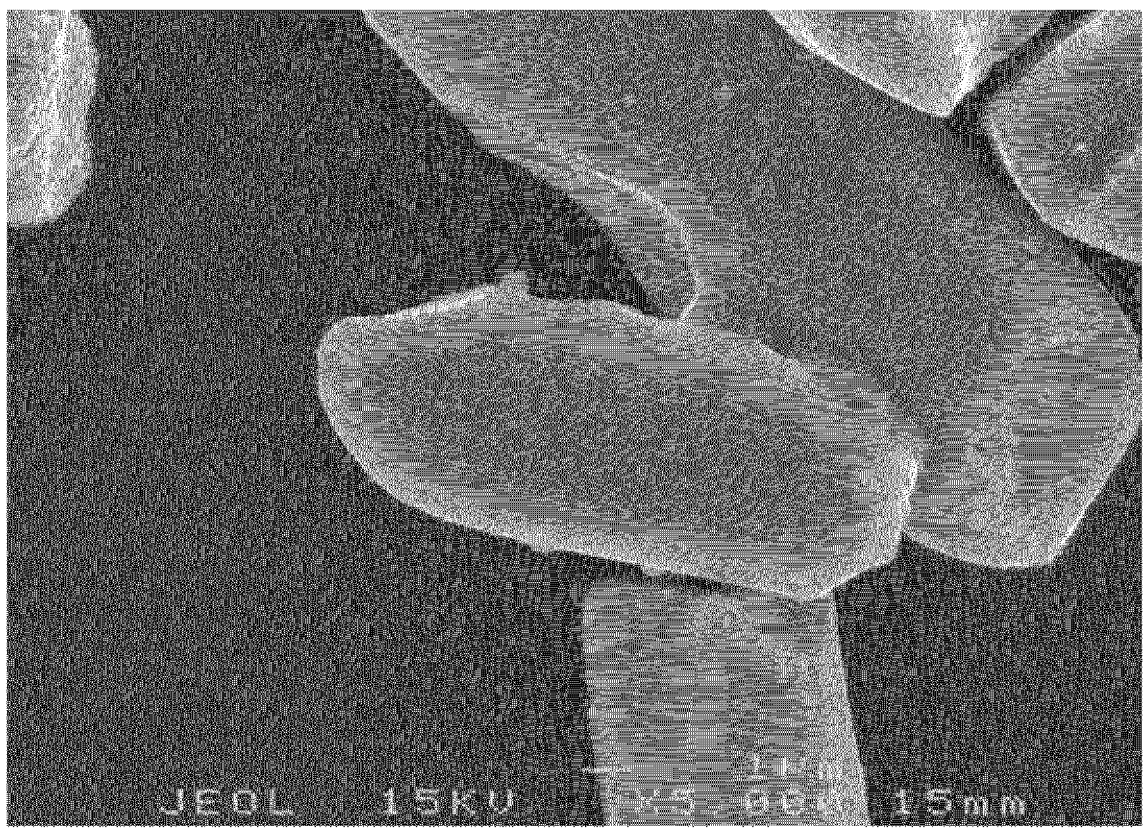
FIG. 2 A microphotograph of a phosphor obtained in Comparative Example 1.

A phosphor powder was produced under the same conditions as in Example 1 except that no boiling treatment with a hydrochloric acid solution was performed. Light-emitting characteristics of the phosphor obtained in Comparative Example 1, together with the results in Example 1, are shown in Table 1. A microphotograph of the phosphor obtained in Comparative Example 1 is illustrated in FIG. 2. It was understood that the conventional phosphor was clearly different in structure from the phosphor of Example 1.

Examples 2 to 5 and Comparative Examples 2 to 5

Each phosphor powder of Examples 2 to 5 and Comparative Examples 2 to 5 was produced under the same conditions as in Example 1 except that the same raw material powder as in Example 1 was used, the pulverization and classification were made so that the average grain size was as shown in Table 1, and furthermore the boiling treatment was performed with the changes in acid concentration and temperature as shown in Table 1. Light-emitting characteristics of each of the phosphors obtained in Examples 2 to 5 and Comparative Examples 2 to 5, together with those in Example 1, are shown in Table 1.

Example 6

A phosphor powder of Example 6 was produced under the same conditions as in Example 1 except that the ratio of raw materials was adjusted so that the compounding ratio satisfied Ca:Eu:Al:Si=0.988:0.012:1.00:1.00. Light-emitting characteristics of the resulting phosphor, together with those in Example 1, are shown in Table 1.

As shown in Table 1, the average grain size, the specific surface area, and the content of oxygen in the phosphor were controlled in the respective specified ranges to result in an enhancement in brightness.

The invention has been described above based on Examples. It is understood by those skilled in the art that such Examples are merely illustrative and various modifications can be made and also fall within the scope of the invention.

INDUSTRIAL APPLICABILITY

The $CaAlSiN_3$ phosphor of the invention is excited by blue light to thereby exhibit high brightness red light emission, and thus can be suitably used in a phosphor for white LEDs with blue light as a light source and can be suitably used in a light-emitting apparatus such as an illumination instrument or an image display apparatus.

The invention claimed is:

1. A phosphor having a main crystal phase having a crystal structure identical to that of $CaAlSiN_3$, and comprising a Ca element partially replaced with an Eu element, wherein the phosphor has a median size d50 of 12.0 μm or more and 22.0 μm or less, as measured according to a laser diffraction scattering method, and has a specific surface area of 1.50 $m^2/g$ or more and 10.00 $m^2/g$ or less, as measured according to a BET method.

2. The phosphor according to claim 1, having a content of oxygen of 1.00% by mass or more and 3.50% by mass or less.

3. The phosphor according to claim 1, wherein an emission peak wavelength in excitation by light at a wavelength of 455 nm is 645 nm or more and 680 nm or less, and an x value and a y value of CIE chromaticity coordinates of an emission color are 0.662 or more and 0.710 or less and 0.290 or more and 0.328 or less, respectively.

4. A light-emitting apparatus comprising the phosphor according to claim 1, and a light-emitting element.

* * * * *